United States Patent [19]

Gagliano

[11] Patent Number: 5,289,336
[45] Date of Patent: Feb. 22, 1994

[54] STATIC ELECTRICITY DISPERSANT

[75] Inventor: George N. Gagliano, Palm Bay, Fla.

[73] Assignee: Harris Corporation, Melbourne, Fla.

[21] Appl. No.: 984,003

[22] Filed: Dec. 1, 1992

Related U.S. Application Data

[63] Continuation of Ser. No. 820,190, Jan. 14, 1992, abandoned.

[51] Int. Cl.⁵ .............................................. H05F 3/02
[52] U.S. Cl. ..................... 361/220; 174/254; 359/62; 359/88; 361/764; 439/66
[58] Field of Search ............ 439/66, 67; 174/51, 174/52.1, 254; 359/62, 88; 361/212, 220, 403, 380, 394, 400, 404, 409, 413, 397, 398, 764; 200/292; 206/328, 329

[56] References Cited

U.S. PATENT DOCUMENTS

| | | | |
|---|---|---|---|
| 4,223,368 | 9/1980 | Dattilo | 361/220 |
| 4,745,518 | 5/1988 | Fang | 361/220 |
| 4,780,604 | 10/1988 | Hasegawa | 361/220 |
| 4,885,659 | 12/1989 | Nowell | 361/220 |
| 4,904,191 | 2/1990 | Munday | 439/68 |
| 4,945,447 | 7/1990 | Aronson | 361/220 |
| 4,961,126 | 10/1990 | Suzuki | 361/394 |
| 5,038,251 | 8/1991 | Sugiyama | 361/398 |
| 5,091,771 | 2/1992 | Bolan et al. | 357/74 |
| 5,096,426 | 3/1992 | Simpson | 439/66 |
| 5,111,277 | 5/1992 | Medeiros, III | 357/74 |
| 5,164,880 | 11/1992 | Cronin | 361/220 |

FOREIGN PATENT DOCUMENTS

| | | | |
|---|---|---|---|
| 59-86031A | 5/1984 | Japan | 359/88 |
| 63-64022A | 3/1988 | Japan | 359/83 |
| 3-238423A | 10/1991 | Japan | 359/88 |

Primary Examiner—Gerald P. Tolin
Attorney, Agent, or Firm—Joel I. Rosenblatt

[57] ABSTRACT

A formable or deformable material is pressed into place and in contact with the leads connected to semiconductor device. A connection is made through a snap or other device to ground or to some other suitable connection. With the deformable material in place, any static electricity appearing on the semiconductor device is dispersed to ground. In this way, static electricity building on a semiconductor device is prevented from being transferred to other connected devices and injury to those devices. The deformable material is electrically conductive and makes contact by being pressed into place around, or on to, exposed contact leads.

6 Claims, 1 Drawing Sheet

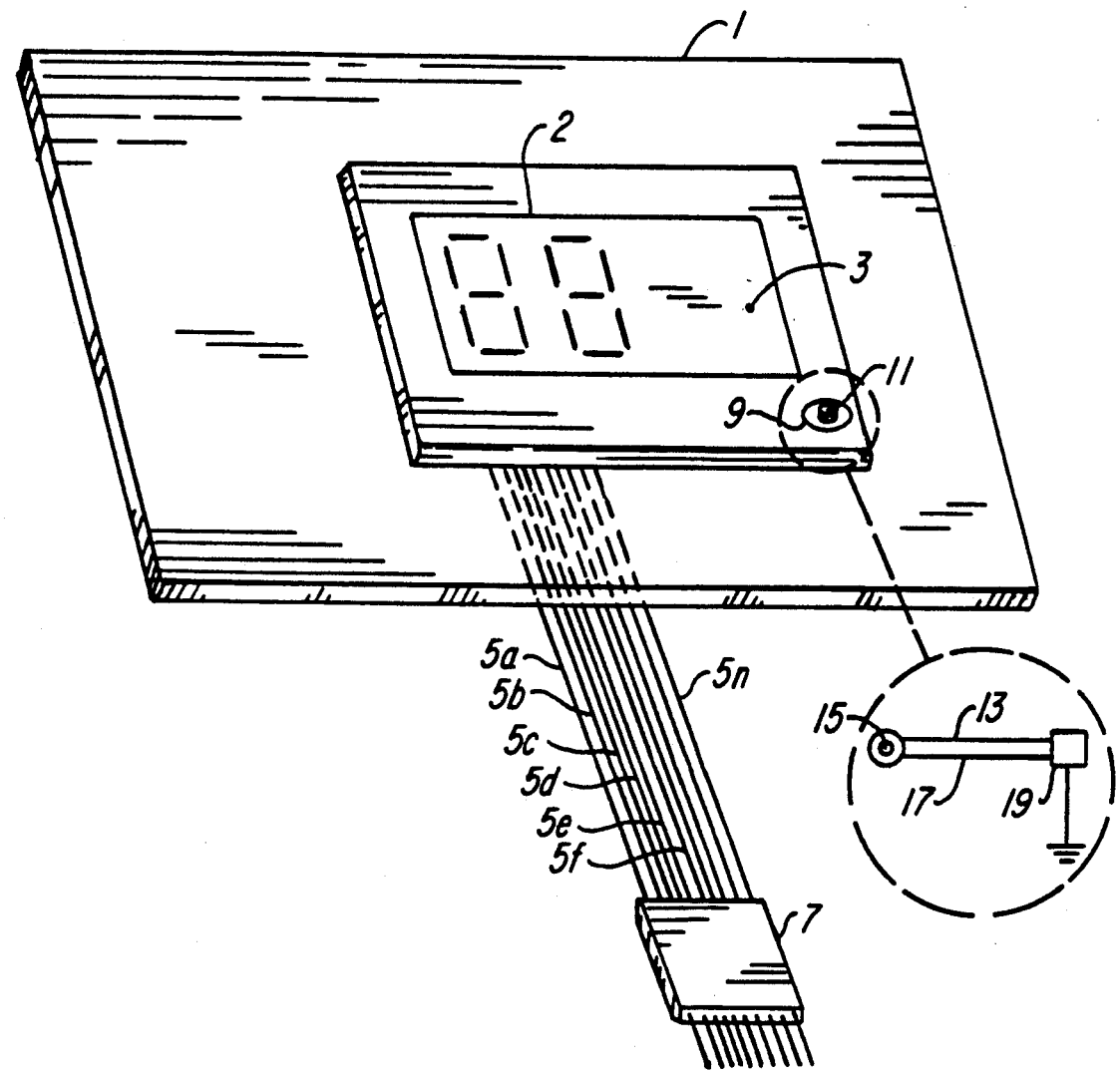

STATIC ELECTRICITY DISPERSANT

This is a continuation of copending application Ser. No. 07/820,190 filed on Jan. 14, 1992 and now abandoned.

BACKGROUND OF THE INVENTION

Semiconductor elements are subject to static electricity. The presence of a static charge may be transferred through contacts to other semiconductor elements within an assembly or dispersed through the layers of a semiconductor element, adversely affecting the electrical or structural integrity of those semiconductor elements. While semiconductor elements may leave the manufacturing zone free of any static electricity, further assembly or processing may induce such static electricity to the detriment of the semiconductor unit's functioning abilities. This introduction of static electricity may occur in any number of ways.

SUMMARY OF THE INVENTION

A method and apparatus is shown which disperses static electricity accumulated on a semiconductor unit. The static dispersing element is placed on the semiconductor unit as packing material. It is designed to be retained on the unit and to be removed after all other unpacking operations are completed and prior to using the unit. Its purpose is to disperse any static electricity which may have been induced into the semiconductor unit or its connected parts during the assembly operations, or during packaging or processing or, more importantly, during unpacking, assembly prior to setup for test and testing, or use.

For example, in the case of the preferred embodiment it has been observed the removal of a clear adhesive strip from the face of an LCD may create static electricity in the LCD units. As is well known clear plastic adhesive back strips are used to protect the clear face of an LCD during processing and shipment and prior to use by the customer. The presence of that static electricity transferred to a device such as an LCD driver has been observed to induce a high voltage charge in the driver transistors and damage in the form of trap sites leading to non-functionality of the driver.

Applied to the preferred embodiment to the invention a packing foam was selected made of a cross linked polyethylene material and available under the trade name VELLOSTAT 2523, manufactured by 3M. The foam is placed into contact with all the pins of the display. A ground connection is made through cable to common ground. Then the unit may undergo further processing as for example removal of the adhesive strip. The presence of the conductive foam pushed into contact with all the pins of the display effectively removes any static electricity generated by additional processing and prevents damage to its associated drivers or any other connected part.

It should be understood however the invention has a broader application than shown in the preferred embodiment. The invention is directed to a process of application of conductive foam or other substance which assures a precise electrical contact, for example for the purpose of grounding of any other such purpose. Accordingly, this invention is directed to a new use for such a conductive formable substance as the conductive foam used in the preferred embodiment.

According to the preferred embodiment, the material used for the practice of this invention is a deformable foam. The formable property of the foam assures a solid contact with each of the pins when pressed into place. However, the invention should not be thought of as limited to a deformable foam and may be used with other suitable material.

DESCRIPTION OF THE DRAWING

The FIGURE shows the use of a formable foam pressed into place to disperse static electricity according to the principles of the invention.

DETAILED DESCRIPTION OF THE INVENTION

As shown in the FIGURE, a block of deformable foam 1 is pressed into place around liquid crystal display (LCD). The foam 1 covers a series of electrical contacts or leads (5A, 5B, 5C . . . 5N) connecting the display 3 shown as having face 2, to driver 7. The foam is shown as having a contact 9 with a fastener 11 therein or connection to connector 15 mounted on conductor strap 17. Connected to the opposite end of the strap is a connection to ground or some other suitable connection shown and ground is 19. The strap assembly comprising connector 15, strip 17, and ground connector 19 is shown as numeral 13.

In operation, the conductive foam block 1 is pressed over the contacts 5 in any suitable way. In the case of the preferred embodiment it is shown as surrounding the display 3. The formable quality of the foam assures direct contact with the contacts 5 connecting in display 3 to element 7 (in this case a LCD driver). When the foam is connected to ground, for example, through strap 13 and connection 11, any static electricity generated in the device 3, such as by removal of any protective coverings is dispersed to ground, avoiding damage to driver 7. As would be known to those skilled in the art, the practice of the principles of this invention is not necessarily restricted to the art of the proponents shown or the configuration shown. Further, a foam material is not necessarily required. In practice of the invention any deformable material may be used which when pressed into place assures contact.

The invention may be used with any deformable or formable material having conductive properties. Additionally, the connection may be made from the pins to any device, in addition to ground, consistent with the purpose of the connection.

I claim:

1. An article for dispersing static electricity to ground from first and second separate semiconductors which are electrically connected by one or more electrical contacts comprising:
   A. a formable conductive material;
   B. a first semiconductor unit having a set of electrical contacts extending from said first semiconductor unit;
   C. a second semiconductor unit electrically connected to said set of electrical contacts and connected to said first semiconductor unit through said set of electrical contacts;
   D. said formable material having a shunt electrical connection to ground;
   E. said formable conductive material placed onto, and in direct electrical contact with said first and second semiconductor units and said set of electrical contacts;

F. said formable conductive material conducting static electricity from said first and second semiconductor units through said shunt electrical connection to ground;

G. said shunt electrical connection to ground includes a connector on said formable material, said connector having a fastener to connect with an electrical connector;

H. said shunt electrical connection to ground includes a strap and a second fastener on said strap to mate with said fastener on said formable material.

2. An article for dispersing static electricity to ground from first and second separate semiconductors which are electrically connected by one or more electrical contacts comprising:

A. a formable conductive material;

B. a first semiconductor unit having a set of electrical contacts extending from said first semiconductor unit;

C. a second semiconductor unit electrically connected to said set of electrical contacts and connected to said first semiconductor unit through said set of electrical contacts;

D. said formable material having a shunt electrical connection to ground;

E. said formable conductive material placed onto, and in direct electrical contact with said first and second semiconductor units and said set of electrical contacts;

F. said formable conductive material conducting static electricity from said first and second semiconductor units through said shunt electrical connection to ground;

G. said shunt electrical connection to ground includes a connector on said formable material, said connector having a fastener to connect with an electrical connector;

H. said shunt electrical connection to ground includes a strap electrically connecting said fastener to ground.

3. An article for dispersing static electricity to ground from first and second separate semiconductors which are electrically connected by one or more electrical contacts comprising:

A. a formable conductive material;

B. a first semiconductor unit having a set of electrical contacts extending from said first semiconductor;

C. a second semiconductor unit electrically connected to said set of electrical contacts and connected to said first semiconductor unit through said set of electrical contacts;

D. said formable material having a shunt electrical connection to ground;

E. said formable conductive material placed onto, and in direct electrical contact with said first and second semiconductor units and said set of electrical contacts;

F. said formable conductive material conducting static electricity from said first and second semiconductor units through said shunt electrical connection to ground; and G. said formable conductive material has embedded within said material a fastener connected to a mating fastener on an electrically conductible strap and said electrical strap is connected to ground.

4. An article dispersing static electricity from a first semiconductor unit to ground comprising:

A. a first semiconductor unit;

B. a formable conductive material;

C. said formable material having an electrical connection;

D. said formable material placed in electrical contact with said first semiconductor unit;

E. said formable material connected through said electrical connection by an electrical shunt to ground establishing a shunt electrical path from said first semiconductor unit to ground and dispersing static electricity to said ground through said electrical shunt;

F. said connection to ground includes a connector on said formable material, said connector having a fastener to mate with an electrical connector; and G. said connection to ground includes a conductive strap, and a second fastener on said conductive strap to mate with said fastener on said formable material.

5. An article dispersing static electricity from a first semiconductor unit to ground comprising:

A. a first semiconductor unit;

B. a formable conductive material;

C. said formable material having an electrical connection;

D. said formable material placed in electrical contact with said first semiconductor unit;

E. said formable material connected through said electrical connection by an electrical shunt to ground establishing a shunt electrical path from said first semiconductor unit to ground and dispensing static electricity to said ground through said electrical shunt;

F. said connection to ground includes a connector on said formable material, said connector having a fastener to mate with an electrical connector; and G. said connection to ground includes a strap, and a second fastener on said strap to mate contact with said fastener on said formable material.

6. An article dispensing static electricity from a first semiconductor unit to ground comprising:

A. a first semiconductor unit;

B. a formable conductive material;

C. said formable material having an electrical connection;

D. said formable material placed in electrical contact with said first semiconductor unit;

E. said formable material connected through said electrical connection by an electrical shunt to ground establishing a shunt electrical path from said first semiconductor unit to ground and dispersing static electricity to said ground through said electrical shunt;

F. said formable conductive material is a conductive foam;

G. said formable conductive material has an embedded fastener for making electrical contact with a mating fastener on an electrically conductive strap and a mating fastener is mounted on said electrical strap to connect said formable material to ground.

* * * * *